United States Patent
Abe et al.

(10) Patent No.: US 10,593,790 B2
(45) Date of Patent: Mar. 17, 2020

(54) NITRIDE SEMICONDUCTOR SUBSTRATE AND METHOD FOR MANUFACTURING THE SAME

(71) Applicant: CoorsTek KK, Shinagawa-ku, Tokyo (JP)

(72) Inventors: Yoshihisa Abe, Kanagawa (JP); Masashi Kobata, Kanagawa (JP); Shintaro Miyamoto, Kanagawa (JP)

(73) Assignee: COORSTEK KK, Shinagawa-Ku, Tokyo (JP)

(*) Notice: Subject to any disclaimer, the term of this patent is extended or adjusted under 35 U.S.C. 154(b) by 32 days.

(21) Appl. No.: 15/900,202

(22) Filed: Feb. 20, 2018

(65) Prior Publication Data
US 2018/0240903 A1    Aug. 23, 2018

(30) Foreign Application Priority Data

Feb. 20, 2017 (JP) ................ 2017-028846
Jan. 26, 2018 (JP) ................ 2018-011099

(51) Int. Cl.
*H01L 29/778* (2006.01)
*H01L 29/20* (2006.01)
(Continued)

(52) U.S. Cl.
CPC ...... *H01L 29/7787* (2013.01); *H01L 21/0217* (2013.01); *H01L 21/0254* (2013.01);
(Continued)

(58) Field of Classification Search
CPC .......... H01L 29/7787; H01L 29/66462; H01L 29/7786
See application file for complete search history.

(56) References Cited

U.S. PATENT DOCUMENTS

| 2002/0167023 A1 | 11/2002 | Chavarkar et al. |
|---|---|---|
| 2007/0164315 A1 | 7/2007 | Smith et al. |

(Continued)

FOREIGN PATENT DOCUMENTS

| CN | 103797581 A | 5/2014 |
|---|---|---|
| JP | 2008-227501 A | 9/2008 |

(Continued)

OTHER PUBLICATIONS

Extended Search Report issued by the European Patent Office in corresponding European Patent Application No. 18157146.4-1212 dated Oct. 11, 2018 (10 pages).
Office Action issued by the Taiwanese Patent Office in the corresponding Taiwanese Patent Application dated Sep. 20, 2018 (6 pages).

*Primary Examiner* — Changhyun Yi
(74) *Attorney, Agent, or Firm* — Buchanan Ingersoll & Rooney PC

(57) ABSTRACT

A structure for increasing the concentration of two-dimensional electron gas without lowering mobility is provided. That is, a nitride semiconductor substrate is provided which includes a first layer, a second layer, and a third layer. The first layer has a composition of $In_{a1}Al_{b1}Ga_{c1}N$ ($0 \leq a1 \leq 1$, $0 \leq b1 \leq 1$, $0 \leq c1 \leq 1$, $a1+b1+c1=1$). The second layer is formed on the first layer. The second layer has a composition of $In_{a2}Al_{b2}Ga_{c2}N$ ($0 \leq a2 \leq 1$, $0 \leq b2 \leq 1$, $0 \leq c2 \leq 1$, $a2+b2+c2=1$) and has a band gap different from that of the first layer. The third layer is formed on the second layer and has a composition of $A_jB_{1-j}N$ (A is a group 13 element, B is a group 13 element or a group 14 element, $A \neq B$, $0 < j < 1$).

4 Claims, 2 Drawing Sheets

(51) Int. Cl.
  *H01L 29/24* (2006.01)
  *H01L 29/267* (2006.01)
  *H01L 23/31* (2006.01)
  *H01L 21/02* (2006.01)
  *H01L 29/205* (2006.01)
  *H01L 29/40* (2006.01)
  *H01L 29/66* (2006.01)

(52) U.S. Cl.
  CPC .... *H01L 21/0262* (2013.01); *H01L 21/02271* (2013.01); *H01L 23/3171* (2013.01); *H01L 29/2003* (2013.01); *H01L 29/205* (2013.01); *H01L 29/24* (2013.01); *H01L 29/267* (2013.01); *H01L 29/408* (2013.01); *H01L 29/66462* (2013.01); *H01L 29/7786* (2013.01)

(56) References Cited

U.S. PATENT DOCUMENTS

| | | | |
|---|---|---|---|
| 2013/0056746 A1* | 3/2013 | Joshin | H01L 29/7781 257/76 |
| 2015/0008444 A1 | 1/2015 | Derluyn et al. | |
| 2015/0263152 A1 | 9/2015 | Yasumoto et al. | |

FOREIGN PATENT DOCUMENTS

| | | | |
|---|---|---|---|
| JP | 2015-177069 A | 10/2015 | |
| TW | 201442230 A | 11/2014 | |

\* cited by examiner

NITRIDE SEMICONDUCTOR SUBSTRATE AND METHOD FOR MANUFACTURING THE SAME

BACKGROUND OF THE INVENTION

Field of the Invention

The present invention particularly relates to a nitride semiconductor substrate used for a high electron mobility transistor (HEMT) and a method for manufacturing the same.

Description of the Related Art

In HEMTs including nitride semiconductors, a technique for improving electrical characteristics by forming various layers (protective layers or cap layers) on the electron supply layer (or barrier layer) is known.

JP 2008-227501 A discloses a group III nitride high electron mobility transistor (HEMT) including a group III nitride based channel layer, a group III nitride based barrier layer on the channel layer, a multi-layer cap layer on the barrier layer, which includes an aluminum nitride (AlN)-containing layer on the barrier layer and a gallium nitride (GaN) layer on the AlN-containing layer, and a SiN passivation layer on the GaN layer.

JP 2015-177069 A discloses a semiconductor device including a GaN-based semiconductor layer, a source electrode, a drain electrode, a gate electrode, a first protective film, and a second protective film. The source electrode is provided on the GaN-based semiconductor layer. The drain electrode is provided on the GaN-based semiconductor layer. The gate electrode is provided on the GaN-based semiconductor layer between the source electrode and the drain electrode. The first protective film is provided in contact with the GaN-based semiconductor layer between the gate electrode and the drain electrode. The second protective film is provided on the first protective film and has a higher resistivity than the first protective film. The first protective film is silicon oxide, silicon nitride, silicon oxynitride, or aluminum oxide, containing, as impurities, gallium (Ga), iron (Fe), chromium (Cr), or nickel (Ni) of $1 \times 10^{18}$ $cm^{-3}$ or more.

In the inventions described in JP 2008-227501 A or JP 2015-177069 A, silicon nitride (SiN) is formed as a protective film via further various layers, if necessary, on an electron supply layer (or barrier layer) including the GaN-based semiconductor.

However, it has been found that, when the SiN film is used as the protective layer as described above, the concentration of two-dimensional electron gas (2DEG) is not sufficiently high. This is considered to be due to high insulation property of the protective film.

In this respect, the semiconductor device described in JP 2015-177069 A includes a first protective film provided in contact with a GaN-based semiconductor layer and a second protective film provided on the first protective film and having a higher resistance than the first protective film. When the first protective film has a certain level of conductivity, charges generated in the GaN-based semiconductor layer can be removed from the GaN-based semiconductor layer, uneven distribution of the charges generated in the GaN-based semiconductor layer in the semiconductor device is suppressed to escape unnecessary charges in the GaN-based semiconductor layer via the first protective film and to distribute the charges in the first protective film. As a result, unintended localization or uneven distribution of charges is prevented. Thus, variation in transistor characteristics such as current collapse can be suppressed.

However, even with the above-described method, it cannot necessarily be said that desirable effects are obtained from the viewpoint of sufficiently increasing the concentration of two-dimensional electron gas.

The present invention has been made in view of the above problems, and an object of the present invention is to provide a nitride semiconductor substrate which can further increase the concentration of two-dimensional electron gas while maintaining mobility in a HEMT having an electron supply layer with a protective film.

SUMMARY OF THE INVENTION

A nitride semiconductor substrate according to the present invention includes a first layer having a composition of $In_{a1}Al_{b1}Ga_{c1}N$ ($0 \leq a1 \leq 1$, $0 \leq b1 \leq 1$, $0 \leq c1 \leq 1$, $a1+b1+c1=1$), a second layer formed on the first layer, having a composition of $In_{a2}Al_{b2}Ga_{c2}N$ ($0 \leq a2 \leq 1$, $0 \leq b2 \leq 1$, $0 \leq c2 \leq 1$, $a2+b2+c2=1$), and having a band gap different from that of the first layer, and a third layer formed on the second layer and having a composition of $A_jB_{1-j}N$ (A is an arbitrary group 13 element, B is an arbitrary group 13 element or group 14 element, $A \neq B$, $0 < j < 1$).

With such a constitution, it is possible to further increase the concentration of two-dimensional electron gas while maintaining mobility.

In addition, the nitride semiconductor substrate according to the present invention preferably has a group 13 nitride cap layer between the second layer and the third layer.

In a preferred embodiment of the present invention, the first layer is a GaN electron transit layer, the second layer is an electron supply layer having a composition of $In_{a2}Al_{b2}Ga_{c2}N$ ($a2=0$, $0 < b2 \leq 1$, $c2 < 1$, $b2+c2=1$), the cap layer is a GaN layer, and the third layer is a $Ga_jSi_{1-j}N$ ($0 < j < 1$) layer.

A manufacturing method for a nitride semiconductor substrate according to the present invention is a method for manufacturing the nitride semiconductor substrate by an metal organic chemical vapor deposition by arranging a GaN electron transit layer as a first layer, an electron supply layer of $In_{a2}Al_{b2}Ga_{c2}N$ ($a2=0$, $0 < b2 \leq 1$, $0 \leq c2 < 1$, $b2+c2=1$) as a second layer, a GaN cap layer, and a $Ga_jSi_{1-j}N$ ($0 < j < 1$) layer as a third layer, in this order. The method includes a first step of forming the second layer continuously on the first layer after the first layer is formed, a second step of forming the cap layer on the second layer after the first step, a third step of supplying a Ga source gas, a Si source gas, and an N source gas over a period of three seconds or less immediately after the completion of the second step to form the third layer, and a fourth step of stopping the supply of the Ga source gas and supplying the Si source gas and the N source gas after the third step.

According to the present invention, a nitride semiconductor substrate and a method for manufacturing the nitride semiconductor substrate can be provided. The nitride semiconductor substrate is capable of increasing the concentration of a two-dimensional electron gas, that is, increasing the electron concentration, without lowering the mobility in a HEMT having an electron supply layer with a protective film.

DESCRIPTION OF THE EMBODIMENTS

Hereinafter, the present invention will be described in detail with reference to the drawings. A nitride semiconductor substrate according to the present invention includes a first layer, a second layer, and a third layer. The first layer has a composition of $In_{a1}Al_{b1}Ga_{c1}N$ ($0 \le a1 \le 1$, $0 \le b1 \le 1$, $0 \le c1 \le 1$, $a1+b1+c1=1$). The second layer is formed on the first layer, has a composition of $In_{a2}Al_{b2}Ga_{c2}N$ ($0 \le a2 \le 1$, $0 \le b2 \le 1$, $0 \le c2 \le 1$, $a2+b2+c2=1$) and has a band gap different from that of the first layer. The third layer is formed on the second layer and has a composition of $A_jB_{1-j}N$ (A is an arbitrary group 13 element, B is an arbitrary group 13 element or group 14 element, $A \ne B$, $0<j<1$).

Figure 1:
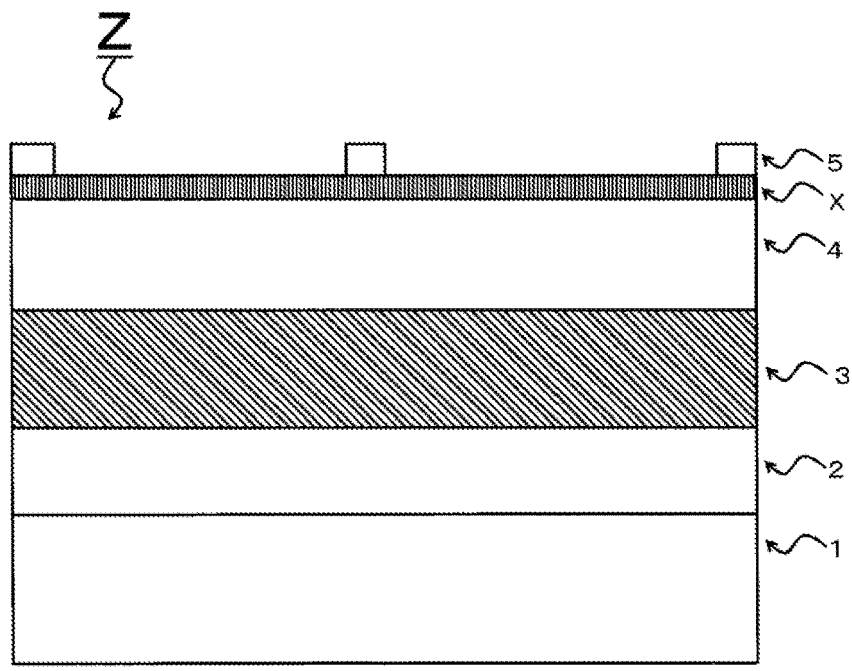
FIG. 1 is a schematic cross-sectional view indicating an embodiment of a nitride semiconductor substrate according to the present invention.

FIG. 1 is a schematic cross-sectional view indicating one embodiment of a nitride semiconductor substrate Z of the present invention, and a base substrate 1, a buffer layer 2, a first layer 3, a second layer 4, a third layer X, and an electrode 5 are included. Specifically, the first layer 3 is an electron transit layer, and the second layer 4 is an electron supply layer.

Figure 2:
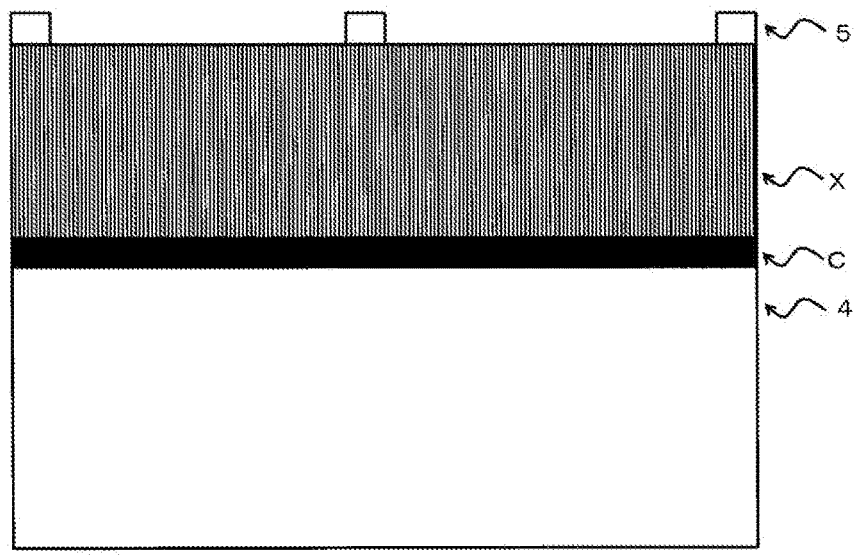
FIG. 2 is a schematic cross-sectional view indicating a preferred embodiment of the nitride semiconductor substrate according to the present invention.

The nitride semiconductor substrate Z indicated in FIG. 2 is a preferred embodiment of the present invention and includes the base substrate 1, the buffer layer 2, the first layer (electron transit layer) 3, a cap layer C, the second layer (electron supply layer) 4, the third layer X, and the electrode 5.

In all of the drawings indicated in the present invention, shapes are schematically simplified and emphasized for explanation, and the shapes, dimensions, and ratios of details are different from the actual shapes, dimensions, and ratios. Further, descriptions of other configurations which are considered unnecessary for explaining the present invention will be omitted.

Examples of the base substrate 1 include such as silicon single crystal, silicon carbide, sapphire, and GaN. In these materials, silicon single crystal tends to be disadvantageous in terms of a withstand voltage in a vertical direction as compared with such as silicon carbide and sapphire having higher insulating property than that of silicon single crystal. However, in the present invention, even in the case where silicon single crystal is used in the base substrate 1, effects thereof can be further remarkably exhibited, and it can be said that silicon single crystal is particularly preferable.

As the buffer layer 2, for example, the buffer layer structure disclosed in JP 5159858 B2 or JP 5188545 B2 can be used. That is, for example, an AlGaN-based multilayer buffer layer or a multilayer buffer layer can be applied. The AlGaN-based multilayer buffer layer includes an AlGaN-based initial buffer layer and a periodically-deposited layer. In the AlGaN-based initial buffer layer, a first layer is composed of AlN with a thickness of 50 to 200 nm, and a second layer is composed of AlGaN with a thickness of 100 to 300 nm. In the periodically-deposited layer, a third layer is composed of GaN with a thickness of 1 to 50 nm, a fourth layer is composed of AlN with a thickness of 1 to 50 nm, and a fifth layer is composed of GaN with a thickness of 200 nm or more. The third layer and the fourth layer are repeatedly deposited a plurality of times in this order, and lastly the fifth layer is deposited. Further, a nitride is repeatedly deposited 5 to 100 times in total in the AlGaN-based multilayer buffer layer. The multilayer buffer layer includes an $Al_xGa_{1-x}N$ single crystal layer ($0.6 \le x \le 1.0$) and an $Al_yGa_{1-y}N$ single crystal layer ($0 \le y \le 0.5$), which are repeatedly deposited in 5 to 100 pairs in the multilayer buffer layer. Further, it is particularly preferable if a high resistance buffer layer, for example, a GaN layer having a carbon concentration of about $1 \times 10^{18}$ to $3 \times 10^{20}$ atoms/cm$^{-3}$, preferably $1 \times 10^{18}$ to $3 \times 10^{18}$ atoms/cm$^{-3}$ and a thickness of 100 nm or more, preferably about 100 to 200 nm is arranged below the electron transit layer 3, since the improvement effect of the withstand voltage in a vertical direction by the GaN layer and the improvement effect of the withstand voltage in a vertical direction according to the present invention are synergistically exhibited.

FIG. 1 indicates a structure in which the first layer 3 and the second layer 4 are formed in this order. The first layer 3 (electron transit layer) has a composition of $In_{a1}Al_{b1}Ga_{c1}N$ ($0 \le a1 \le 1$, $0 \le b1 \le 1$, $0 \le c1 \le 1$, $a1+b1+c1=1$). The second layer 4 (electron supply layer) has a different band gap from that of the first layer 3 and has a composition of $In_{a2}Al_{b2}Ga_{c2}N$ ($0 \le a2 \le 1$, $0 \le b2 \le 1$, $0 \le c2 \le 1$, $a2+b2+c2=1$).

Specific examples of $In_{a1}Al_{b1}Ga_{c1}N$ ($0 \le a1 \le 1$, $0 \le b1 \le 1$, $0 \le c1 \le 1$, $a1+b1+c1=1$) in the electron transit layer include InN, AlN, GaN, InAlN, InGaN, AlGaN, and InAlGaN. Among these nitrides, such as GaN, AlGaN, and InGaN are preferable, and GaN is further preferable. Incidentally, elements forming InAlN, InGaN, AlGaN, and InAlGaN may have various composition ratios.

Specific examples of $In_{a2}Al_{b2}Ga_{c2}N$ ($0 \le a2 \le 1$, $0 \le b2 \le 1$, $0 \le c2 \le 1$, $a2+b2+c2=1$) in the electron supply layer include InN, AlN, GaN, InAlN, InGaN, AlGaN, and InAlGaN. Among these nitrides, such as AlN, AlGaN, and InGaN are preferable, AlN and AlGaN are further preferable, and AlGaN is particularly preferable. Incidentally, elements forming InAlN, InGaN, AlGaN, and InAlGaN may have various composition ratios.

Regarding the electron transit layer and the electron supply layer, there are no restrictions on the layer thickness. However, usually the electron transit layer is 10 nm or more thick, preferably 300 to 2500 nm thick, and the electron supply layer is 1 to 100 nm thick, preferably 10 to 100 nm thick.

There is also no limit to the amount of impurities contained in the first layer 3 and the second layer 4. Incidentally, examples of the impurities include carbon, phosphorus, magnesium, silicon, iron, oxygen, and hydrogen.

In addition, a spacer layer may be interposed between the electron transit layer and the electron supply layer. The spacer layer in which two-dimensional electrons formed at the interface between the electron transit layer and the electron supply layer are scattered by enhancing the confinement effect of the two-dimensional electrons, has a role of suppressing a decrease in mobility. The spacer layer has a thickness of about several molecular layers and is formed by using a material such as AlN having a large band gap, for example.

The nitride semiconductor substrate Z of the present invention includes the third layer X formed on the second layer 4, having a composition of $A_jB_{1-j}N$ (A is an arbitrary group 13 element, B is an arbitrary group 13 element or group 14 element, and $A \ne B$, $0<j<1$).

This third layer X plays a role as a protective layer in a broad sense, and in the present invention, in particular, it has an action to avoid problems caused by exposure of an electron supply layer to the atmosphere.

Generally, as such a protective layer, an insulating film such as SiN has been conventionally used in such a protective layer. However, in the case where the insulating film is provided on an electron supply layer, when the electron concentration is increased, the mobility tends to be lowered.

The present inventors have studied an optimum material and structure as such a protective layer and found a preferable material. The material is basically an insulator and partially has conductivity, and the conductive portion has a structure with high crystallinity. Such a material has a composition of $A_jB_{1-j}N$ (A is an arbitrary group 13 element, B is an arbitrary group 13 element or group 14 element, and $A \neq B$, $0 < j < 1$).

An example of $A_jB_{1-j}N$ (A is an arbitrary group 13 element, B is an arbitrary group 13 element or group 14 element, $A \neq B$, $0 < j < 1$) forming the third layer X includes a nitride having a combination in which A is arbitrarily selected from Ga, In, and Al, and B is arbitrarily selected from Si and Ge. Among these, more specifically, such as GaSiN, GaGeN, and AlSiN can be applied, and GaSiN is further preferable. It is noted that SiN forming the conventional SiN layer is expressed as $A_jB_{1-j}N$ (A is a group 13 element, B is Si of a group 14 element, and $A \neq B$, $j=0$) according to the present invention.

By having the composition of the third layer X is not merely an insulating film but maintains crystallinity that is about the same as that of the second layer 4 which is an electron supply layer. As a result, the lattice mismatch at the interface between the second layer 4 and the third layer X is also small. This suppresses deterioration of electronic behavior at the interface, as compared with the case of forming an insulating layer in which both the resistance difference and the degree of lattice mismatch increase.

In this respect, considering that the first protective film is a silicon nitride film containing Ga as an impurity in the invention described in JP 2015-177069 A, the composition of $A_jB_{1-j}N$ in the present invention shows significant effect difference due to the above-described high crystallinity and stability at the interface.

The thickness of the third layer X is preferably 1 nm or more and 10 nm or less, further preferably 5 nm or less.

As described above, the third layer X affects the behavior of electrons at the interface with the second layer 4, and if the third layer X is too thick, the effect of stress due to the difference in lattice constant cannot be ignored. However, if the thickness is less than 1 nm, not only the effect of the present invention cannot be obtained sufficiently but it is difficult to form the layer.

When j in $A_jB_{1-j}N$ of the third layer X is at least 0.01 or more, the effect of the present invention can be obtained, and its effect will not be impaired up to 0.95. Preferably, j is 0.3 or more and 0.6 or less.

In the present invention, the cap layer C composed of a group 13 nitride may be provided between the second layer 4 and the third layer X. FIG. 2 is a schematic cross-sectional view indicating a preferred embodiment of the nitride semiconductor substrate of the present invention, that is, a structure further having the cap layer C on the second layer 4. For example, if the cap layer has a thickness of about 1 to 3 nm and is not an insulating layer, the effect of the present invention is not impaired.

In the preferred embodiment of the present invention, the first layer 3 is composed of GaN as an electron transit layer, the second layer 4 is composed of $In_{a2}Al_{b2}Ga_{c2}N$ ($a2=0$, $0 < b2 \leq 1$, $0 \leq c2 < 1$, $b2+c2=1$) as an electron supply layer, and the cap layer C is composed of GaN, and the third layer X is composed of $Ga_jSi_{1-j}N$ ($0 < j < 1$). In this case, j is more preferable if it is about 0.4 to 0.5.

Figure 3:
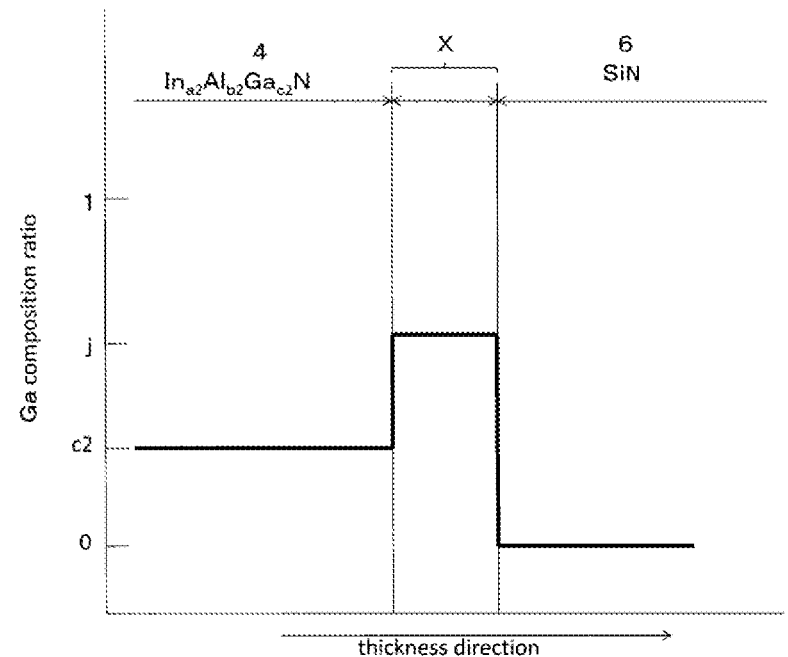
FIG. 3 is a schematic view typically indicating the form of a Ga composition ratio in a layer in another embodiment of the nitride semiconductor substrate of the present invention.
Figure 4:
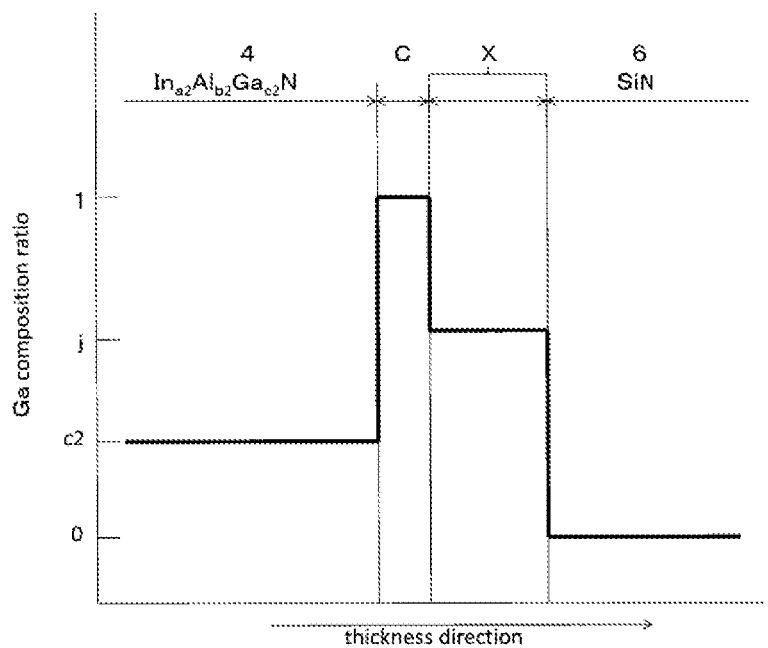
FIG. 4 is a schematic view typically indicating the form of a Ga composition ratio in a layer in another preferred embodiment of the nitride semiconductor substrate of the present invention.

FIG. 3 is a schematic view typically indicating a form of a Ga composition ratio in a layer in another embodiment of the present invention. In this manner, a SiN protective layer 6 may be formed on the third layer X. FIG. 4 is a schematic view typically indicating a form of a Ga composition ratio in a layer when the cap layer C is inserted, in the preferred embodiment of the present invention.

In one embodiment indicated in FIG. 3, a layer of a nitride compound of mixed crystal including Ga and Si to be the third layer X is provided between the SiN protective layer 6 and the second layer 4 (electron supply layer), and it is possible to increase the electron concentration without lowering the mobility. As a result, a sheet resistance can be suppressed. Further, as in one preferred embodiment indicated in FIG. 4, by providing a cap layer between the second layer 4 (electron supply layer) and the third layer X, the Ga composition ratio is less decreased, the effect of the present invention becomes remarkable.

One embodiment of the manufacturing method according to the present invention includes a first step, a second step, a third step, and a fourth step. In the first step, a first layer and a second layer are continuously formed by using metal organic chemical vapor deposition (MOCVD). In the second step, a cap layer is successively formed. In the third step, a Ga source gas, a Si source gas, and a N source gas are supplied for a period of more than zero second but up to three seconds immediately after the end of the second step. In the fourth step, after the three steps, the supply of the Ga source gas is stopped, and only the Si source gas and the N source gas are supplied.

That is, in the present invention, in particular, in the third step and the fourth step, the source gas of the element A (for example, Ga) in the third layer X is supplied with the source gas of the element B (for example, Si) and nitrogen source gas under the above-described crystal growth condition. As a result, a structure having the effect of the present invention can be obtained.

In addition, in the MOCVD method, crystal growth occurs with a time lag after the supply of the source gas is stopped. In the present invention, it is possible to form thin $Ga_jSi_{1-j}N$ having j of 0.01 or more on the second layer 4 by suppressing the supply time of the source gas of the element A to three seconds or less.

Note that $Ga_jSi N$ which is thin and having j of 0.01 or more can be formed also by, for example, a molecular beam epitaxy (MBE) method. However, production efficiently in the MBE method is significantly low as compared with the case where the first layer 3 and the second layer 4 are formed in the MOCVD method.

As described above, in the nitride semiconductor substrate of the present invention, by adding Ga to a silicon nitride film, it is possible to increase the electron concentration without lowering the mobility. As a result, the sheet resistance can be suppressed. As a result, the nitride semiconductor substrate of the present invention is suitable as a nitride semiconductor substrate for HEMT which is more excellent in electric characteristics.

EXAMPLES

Hereinafter, the present invention will be specifically described based on an example. However, the present invention is not limited thereto.

[Common Experimental Conditions]

A p-type silicon single crystal substrate having a diameter of 6 inches, a thickness of 675 μm, a specific resistance of 0.002 Ωcm, and a plane orientation (111) is prepared. The silicon single crystal substrate has been cleaned by a well-known substrate cleaning method, set in an MOCVD apparatus, and raised in temperature. After the gas in the apparatus has been replaced with a carries gas, heat treatment has been performed in an atmosphere of 100% hydrogen at 1000° C. for 15 minutes to remove a natural oxide film on the surface of the silicon single crystal.

Next, an initial layer composed of AlN single crystal having a thickness of 70 nm has been vapor-deposited at a growth temperature of 1000° C. using trimethylaluminum (TMA) and ammonia ($NH_3$) as source gases.

A single layer of $Al_{0.1}Ga_{0.9}N$ with a carbon concentration of $5\times10^{19}$ atoms/$cm^{-3}$ and a thickness of 300 nm has been vapor-deposited on the initial layer by using trimethylgallium (TMG), TMA, and $NH_3$ as source gases. Next, a 5 nm thick AlN thin layer and a 30 nm thick $Al_{0.1}Ga_{0.9}N$ thin layer have been alternately formed with a carbon concentration of $5\times10^{19}$ atoms/$cm^{-3}$ to form a multilayer of eight layers each. Then, an $Al_{0.1}Ga_{0.9}N$ single layer having a concentration of $5\times10^{19}$ atoms/$cm^{-3}$ has been grown to a thickness of 125 nm. The multilayer and the single layer have been further repeated four times in this order. Further, a GaN single layer having a carbon concentration of $1\times10^{18}$ atoms/$cm^{-3}$ and a thickness of 500 nm has been deposited to forma series of buffer layers including an $Al_{0.1}Ga_{0.9}N$ single layer having a thickness of 300 nm as an initial layer. Thereafter, a GaN single layer having a carbon concentration of $1\times10^{16}$ atoms/$cm^{-3}$ and a thickness of 700 nm has been deposited in the same manner as an electron transit layer, and $Al_xGa_{1-x}N$ (x=1) has been formed to 2 nm thickness as an electron supply layer. After formation of the initial layer, the buffer layer, the electron transit layer, and the electron supply layer have been formed by making slight adjustments in the range of 1 to 15° C. on the basis of the growth temperature of 1000° C.

Example 1

On the electron supply layer, a GaN layer as a cap layer is formed with a thickness of 1 nm, followed by a third layer with a thickness of 4 nm. In the film formation of the third layer, silane ($SiH_4$), $NH_3$, and TMGa are supplied for three seconds at the same time, then only TMGa supply is stopped, and $SiH_4$ and $NH_3$ are supplied for five more seconds to form $Ga_jSi_{1-j}N$ ($0<j<1$) layer. The thickness of Ga is about 1 nm, and the j value is about 0.5.

Comparative Example 1

As in the Example 1, except that the deposition time of the third layer has been adjusted without supplying TMGa, formation of a cap layer and formation of a SiN layer with a thickness of about 4 nm have been performed.

[Evaluation]

For the nitride semiconductor substrates according to the Example 1 and the Comparative Example 1, mobility and carrier concentration have been evaluated. That is, electrodes have been formed on the surfaces of these nitride semiconductor substrates, and the Hall effect has been measured. The Hall effect has been measured using the Van der Pauw method, and the measurement has been carried out using ACCENT HL5500PC. The sheet resistance has been also measured using this electrode.

The results will be shown below.

TABLE 1

| | Mobility (sq. cm/Vs) | Carrier concentration (/sq. cm) | Sheet resistance (Ohm/sq.) |
|---|---|---|---|
| Example 1 | 1246 | 1.45E+13 | 345 |
| Comparative Example 1 | 1259 | 0.92E+13 | 544 |

From Table 1, the mobility is about the same as about 1250 sq.cm/Vs in the Example 1 and the Comparative Example 1. However, in the nitride semiconductor substrate according to the Comparative Example 1, the carrier concentration is 0.92E+13/sq. cm, whereas in the nitride semiconductor substrate according to the Example 1, the carrier concentration is 1.45E+13/sq. cm. As a result, the sheet resistance is 544 Ohm/sq. in the Comparative Example 1 and 345 Ohm/sq. in the Example 1.

From these facts, it can be seen that the electron density of the nitride semiconductor substrate of the present invention is improved while having the same mobility as the conventional spacer layer structure.

What is claimed is:

1. A nitride semiconductor substrate, comprising:
   a first layer having a composition of $In_{a1}Al_{b1}Ga_{c1}N$ ($0\leq a1\leq 1$, $0\leq b1\leq 1$, $0\leq c1\leq 1$, a1+b1+c1=1);
   a second layer formed on the first layer, the second layer having a composition of $In_{a2}Al_{b2}Ga_{c2}N$ ($0\leq a2\leq 1$, $0\leq b2\leq 1$, $0\leq c2\leq 1$, a2+b2+c2=1), the second layer having a band gap different from a band gap of the first layer; and
   a third layer formed on the second layer and having a composition of $Ga_jSi_{1-j}N$ ($0.3\leq j\leq 0.6$).

2. The nitride semiconductor substrate according to claim 1, comprising a group 13 nitride cap layer between the second layer and the third layer.

3. The nitride semiconductor substrate according to claim 2,
   wherein the first layer is a GaN electron transit layer,
   the second layer is an electron supply layer having a composition of $In_{a2}Al_{b2}Ga_{c2}N$ (a2=0, $0<b2\leq 1$, $0\leq c2<1$, b2+c2=1),
   the cap layer is a GaN layer, and
   the third layer is a $Ga_jSi_{1-j}N$ ($0.3\leq j\leq 0.6$) layer.

4. A method for manufacturing a nitride semiconductor substrate by metal organic chemical vapor deposition, in which the nitride semiconductor substrate includes a GaN electron transit layer as a first layer; an electron supply layer of $In_{a2}Al_{b2}Ga_{c2}N$ (a2=0, $0<b2\leq 1$, $0\leq c2<1$, b2+c2=1) as a second layer; a GaN cap layer; and a $Ga_jSi_{1-j}N$ ($0.3\leq j\leq 0.6$) layer as a third layer, in this order,
   the method comprising:
   a first step of forming the second layer continuously on the first layer after the first layer is formed;
   a second step of forming the cap layer on the second layer after the first step; a third step of supplying a Ga source gas, a Si source gas, and an N source gas over a period of three seconds or less immediately after the completion of the second step to form the third layer; and
   a fourth step of stopping the supply of the Ga source gas and supplying the Si source gas and the N source gas after the third step.

* * * * *